United States Patent
Daubenspeck et al.

(10) Patent No.: US 6,375,159 B2
(45) Date of Patent: *Apr. 23, 2002

(54) HIGH LASER ABSORPTION COPPER FUSE AND METHOD FOR MAKING THE SAME

(75) Inventors: Timothy H. Daubenspeck, Colchester; William T. Motsiff, Essex Junction, both of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,915

(22) Filed: Apr. 30, 1999

(51) Int. Cl.[7] .............................................. H01L 29/00
(52) U.S. Cl. ........................ 251/529; 257/762; 257/764
(58) Field of Search ................................ 257/762, 529, 257/764; 438/132, 281, 601

(56) References Cited

U.S. PATENT DOCUMENTS

| | | | |
|---|---|---|---|
| 4,647,340 A | * 3/1987 | Szluk et al. ................. | 156/662 |
| 4,826,785 A | 5/1989 | McClure et al. | |
| 4,985,750 A | * 1/1991 | Hoshino ........................ | 357/71 |
| 5,321,264 A | 6/1994 | Verheyen et al. ...... | 250/339.11 |
| 5,321,322 A | * 6/1994 | Verheyen et al. ......... | 307/465.1 |
| 5,420,455 A | 5/1995 | Gilmour et al. | |
| 5,523,253 A | 6/1996 | Gilmour et al. | |
| 5,608,257 A | 3/1997 | Lee et al. | |
| 5,663,590 A | 9/1997 | Kapoor | |
| 5,731,624 A | * 3/1998 | Motsiff et al. ............... | 257/529 |
| 5,760,674 A | * 6/1998 | Gilmour et al. ............ | 337/297 |
| 5,795,819 A | 8/1998 | Motsiff et al. | |
| 6,061,264 A | * 5/2000 | Giust et al. .................... | 365/96 |
| 6,078,091 A | * 6/2000 | MacPherson et al. ....... | 257/529 |
| 6,111,301 A | * 8/2000 | Stamper ...................... | 257/529 |
| 6,163,062 A | * 12/2000 | Shiratake et al. ........... | 257/529 |
| 6,175,145 B1 | * 1/2001 | Lee et al. .................... | 257/529 |

* cited by examiner

Primary Examiner—Steven Loke
Assistant Examiner—Douglas W. Owens
(74) Attorney, Agent, or Firm—Delio & Peterson, LLC; Robert Curcio; Howard J. Walter, Jr.

(57) ABSTRACT

A high laser absorption copper fuse can minimize the laser energy needed to delete the fuse portion of the conductor. Significantly, this type of fuse structure would allow for formation of copper fuses that can be deleted with appreciably less incident energy, mainly by increasing the absorption of the fuse link at the given incident laser energies.

A metal wiring line contains a fuse link segment wherein the fuse link segment is composed of a stack of at least two metals. The underlayer material in the stack of metals is the primary electrical copper conductor, and the overlayer metal, also an electrical conductor, primarily tungsten or titanium-tungsten in composition, has predetermined thickness and optical properties chosen such that the combination of the overlayer metal with the underlayer metal provides for high absorption characteristics to incident infrared energy.

Fabrication methods for providing overlaying material to the entire fuse link line, or to selective portions of the fuse link line are presented.

11 Claims, 4 Drawing Sheets

HIGH LASER ABSORPTION COPPER FUSE AND METHOD FOR MAKING THE SAME

BACKGROUND OF THE INVENTION

1. Field of the Invention

This invention relates to a fuse element used in integrated circuit devices, and more particularly to the structure of a fuse link to be deleted by laser radiation. The invention further relates to the method of making the fuse link.

2. Description of Related Art

Fuses are used in semiconductor chips to provide redundancy, electrical chip identification, and customization of function. For designs having three (or more) layers of wiring, the fuses are typically formed from a segment of one of the wiring layers, usually the last metal layer or the penultimate metal layer, i.e., the "last metal minus one" wiring layer.

Fusing is the deletion of a segment of metal fuse line. One standard way this can be accomplished is by exposing the segment to a short, high intensity pulse of light energy from a laser, typically having infrared wavelength. The metal line absorbs the laser light energy, melts, and ruptures, disrupting line continuity and causing high electrical resistance, i.e., an open line. A sensing circuit may be used to detect this fuse segment resistance. The technique of laser fuse deleting or trimming has been widely used both in memory and logic integrated circuit fabrication.

Fuse fabrication has taken advantage of the energy transfer from infrared laser light. Lasers allow for precise selection and illumination of integrate circuit segments. Using this technology to delete fuse links facilitates IC fabrication. For example, in U.S. Pat. No. 5,608,257 issued to Lee, et al., on Mar. 4, 1997, entitled, "FUSE ELEMENT FOR EFFECTIVE LASER BLOW IN AN INTEGRATED CIRCUIT DEVICE," a fuse structure is taught that increases absorption of the laser energy, having a melt-away elongated fuse link joining two segments of an interconnecting line, a plurality of fins integral and coplanar to the fuse link such that each of the fins transversally extends away from the fuse link, and a reflecting plate positioned underneath the fuse link to reflect the applied laser energy. By adding structure to the fuse link (fins and reflective pad), the fuse is made more absorptive of the infrared laser energy. Thus, minimizing the incident energy required to delete the fuse.

In some circuits, such as CMOS logic circuits, the fuses are located in arrays close together. This close proximity of fuses provides technical challenges when infrared laser light is applied to blow a particular fuse. Spurious reflections of beam energy and the explosive effects of fuse blowing can adversely affect any element adjacent to the blown fuse link.

In U.S. Pat. No. 5,420,455, issued to Gilmour, et al., on May 30, 1995, entitled, "ARRAY FUSE DAMAGE PROTECTION DEVICES AND FABRICATION METHOD," an approach to limit these reflections is taught by adding non-frangible, high melting point barriers, positioned adjacent to the fuse structures, to prevent both the beam energy and the effects of fuse blowing to reach or affect any adjacent element in the circuit. These barriers act as protective shields for adjacent structures.

Inter-element dimensions in these arrays remain an essential characteristic. However, technology advances require that these dimensions continue to get smaller.

As the reflectivity, mass, and melting temperature of the fuse link metal increases, higher laser energies and longer (or multiple) laser pulses are required to accomplish deletion of the fusible link. These higher energies and longer pulses provide sufficient energy to adjacent and underlying structures, e.g., silicon under the fuse area, to cause severe damage to the interlayer dielectric oxide and adjacent fuse wiring. Additionally, infrared laser deletion of copper fuses is more difficult due to the high reflectivity of copper, especially in the 1.0 to 1.4 $\mu$m wavelength range that is commonly available in laser fuser tools.

Bearing in mind the problems and deficiencies of the prior art, it is therefore an object of the present invention to provide a fusible link structure and method for making the same that allows for deletion of fuses having high reflective, high melting point conductors, when exposed to an infrared laser energy beam at energy levels lower than that required in the current state of the art for blowing fuse links.

It is another object of the present invention to provide a fusible link with increased absorption to infrared laser light.

A further object of the invention is to provide a fusible link that allows for close placement of fuse arrays without structural damage to adjacent structures during fuse deletion, and without the need for protective barriers between adjacent structures.

Still other advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a conductor having a given conductivity characteristic that can be substantially altered by radiation, comprising an electrical conductor having a first layer of a first material that is substantially insensitive to the radiation, and a second layer of a second material that is sensitive to radiation. The sensitivity of the second material is to radiation emitted from a laser in an infrared energy spectrum. The first material is a primary electrical conductor and the second material is an electrical conductor of a composition such that when combined with the primary electrical conductor provides for a high infrared energy absorbing structure.

The first material is copper and the second material is tungsten or a titanium-tungsten composition. The infrared energy spectrum comprises energy having wavelengths in the range of 1.0 to 1.4 $\mu$m. The first layer of the first material is greater than or equal to 500 angstroms in thickness, and the second layer of the second material is greater than or equal to 500 angstroms in thickness.

In a second aspect, the invention is directed to a fusible link that can be selectively opened by laser radiation at a predetermined wavelength, comprising a first conductor that is not substantially absorptive for the radiation at the predetermined wavelength, and a second conductor that is substantially absorptive for the radiation at the predetermined wavelength.

In a third aspect, the invention is directed to a fusible link having a given conductivity characteristic that can be substantially altered by infrared radiation, comprising a first layer of copper, and a second metal layer, wherein the second metal layer is tungsten or titanium-tungsten that is sensitive to the infrared radiation. The infrared radiation comprises energy in the range of 1.0 to 1.4 $\mu$m wavelengths.

In a fourth aspect, the invention is directed to a method for making a conductor on a semiconductor substrate sensitive to incident infrared radiation, comprising the steps of: a) forming a damascene copper wiring underlayer on the semiconductor substrate; b) recessing the copper underlayer to a first predetermined thickness; c) depositing a metal overlayer at a second predetermined thickness on the copper underlayer, having optical properties for absorbing the infrared radiation at an amount greater than the copper underlayer; and, d) polishing the metal overlayer to remove extraneous metal, and having the metal overlayer cover the copper underlayer in its entirety.

The method may further comprise the step of e) completing integrated circuit fabrication or other passivation sequence.

The method step (b), recessing the copper underlayer, further comprises using a blanket wet etch.

In the method step (c), the metal overlayer is tungsten or titanium-tungsten, and depositing the metal overlayer, further comprises using a chemical vapor deposition technique or a sputtering technique. The blanket wet etch comprises ammonium persulfate.

In a fifth aspect, the invention is directed to a method for making a conductor on a semiconductor substrate sensitive to incident infrared radiation, comprising the steps of: a) providing the semiconductor substrate having a surface with integrated circuit device structures thereon; b) applying a silicon oxide layer over the substrate surface and the integrated circuit device structures; c) applying a first photoresist mask to the silicon oxide layer to outline a fuse link line; d) imaging and etching the first photoresist mask to form the fuse link line in the silicon oxide layer at a first predetermined depth; e) applying a second photoresist mask to the silicon oxide layer; f) imaging and etching the second photoresist mask to form vias; g) stripping the second photoresist mask and depositing within the fuse link line and the vias a first conductive material; h) recessing the first conductive material to a second predetermined depth; i) depositing within the recessed area a second material, such that when the second material is combined with the first conductive material the combination is capable of absorbing more of the infrared radiation than the first conducting material alone; and, j) planarizing and applying a protective passivation layer over the fuse link line.

Etching the first photoresist mask to a first predetermined depth, comprises etching to a depth greater than or equal to 500 angstroms.

In step (g), depositing a first conductive material, comprises depositing copper metal. In step (h), the second predetermined depth is greater than or equal to 500 angstroms. Additionally, in step (i) the second material comprises a tungsten composition.

In a sixth aspect, the invention is directed to a method for selectively making a fuse on a conductor of a semiconductor substrate, having a sensitivity to incident infrared radiation, comprising the steps of: a) providing the semiconductor substrate having a surface with integrated circuit device structures thereon; b) applying a silicon oxide layer over the substrate surface and the integrated circuit device structures; c) applying a first photoresist mask to the silicon oxide layer to outline a fuse link line; d) imaging and etching the first photoresist mask to form the fuse link line in the silicon oxide layer at a first predetermined depth; e) applying a second photoresist mask to the silicon oxide layer; f) imaging and etching the second photoresist mask to form vias; g) stripping the second photoresist mask and depositing within the fuse link line and the vias a first conductive material; h) applying a third photoresist mask over the fuse link line and the vias to form a recessed area of a second predetermined depth for the fuse; i) imaging and etching the third photoresist mask in the fuse area; j) depositing within the recessed area a second material, such that when the second material is combined with the first conductive material the combination is capable of absorbing more of the infrared radiation than the first conducting material alone; and, k) planarizing and applying a protective passivation layer over the fuse link line.

In a seventh aspect, the invention is directed to a method for selectively making a fusible link on a semiconductor substrate, the link sensitive to incident infrared radiation, comprising the steps of: a) forming a damascene copper wiring underlayer on the semiconductor substrate; b) applying and imaging a photoresist mask to limit portions of the copper wiring underlayer for enhanced sensitivity to the incident infrared radiation; c) recessing the portions of the copper underlayer to a first predetermined thickness; d) removing the photoresist mask; e) depositing a titanium-tungsten metal overlayer at a second predetermined thickness on the copper wiring underlayer, having optical properties for absorbing the infrared radiation at an amount greater than the copper underlayer; and, f) polishing the metal overlayer to remove extraneous metal, and having the titanium-tungsten metal overlayer cover the copper underlayer in its entirety.

In an eighth aspect the invention is directed to a fuse structure for use with IC designs comprising an overlayer and an underlayer wiring, defined using a damascene process, the wiring made from metals which are highly reflective to energies in the 1.0 $\mu$m to 1.4 $\mu$m wavelength range. The thickness and optical properties of the overlayer maximizes the absorption of infrared energy by the structure. The underlayer is a copper prime conductor, and the overlayer acts as a diffusion barrier. The overlayer may be a diffusion barrier for Sn.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
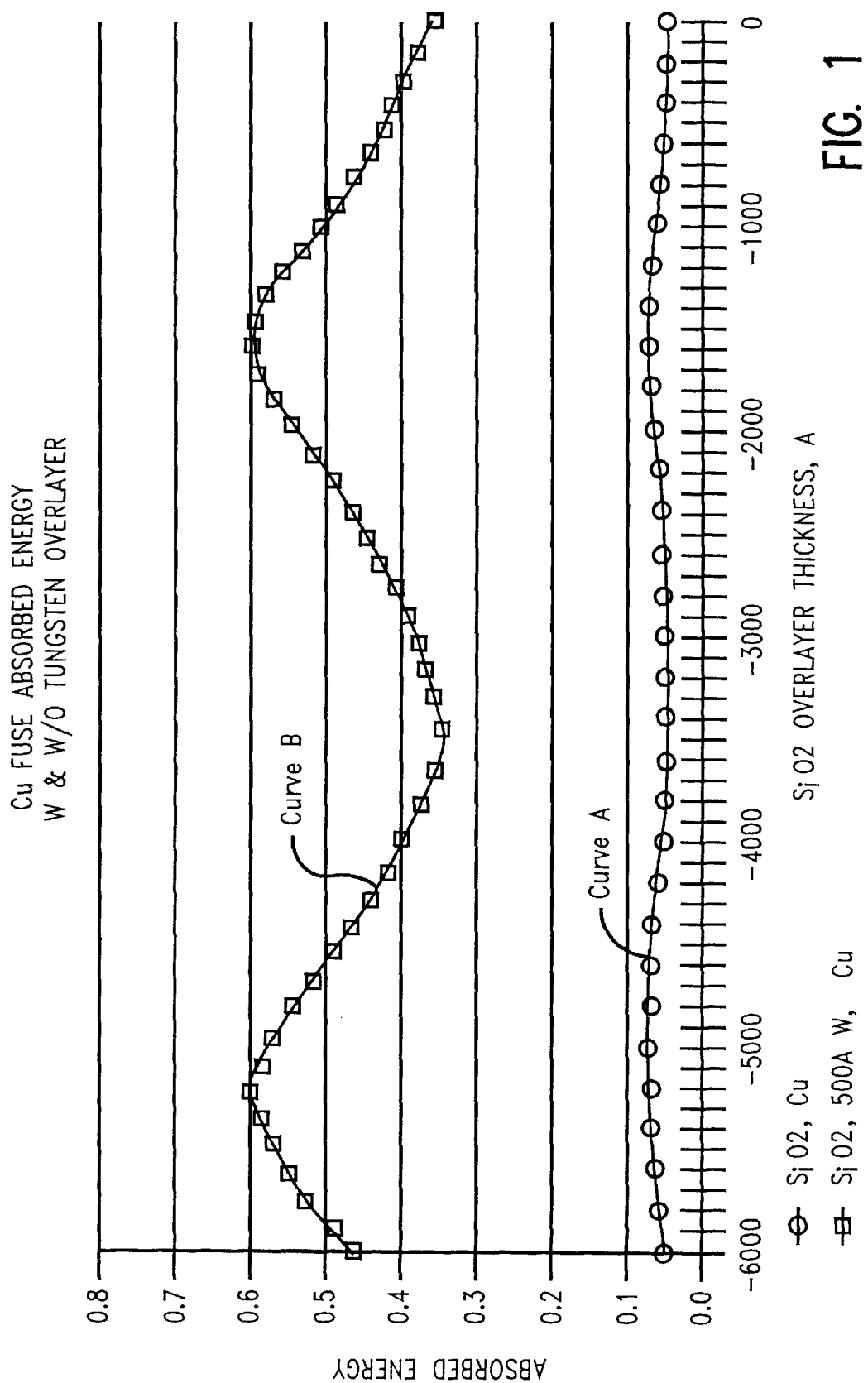
FIG. 1 is a graph of the comparative absorption characteristics of a copper fuse with and without a tungsten overlayer, as a function of silicon oxide ($SiO_2$) thickness.

In describing the preferred embodiment of the present invention, reference will be made herein to FIGS. 1–3 of the drawings in which like numerals refer to like features of the invention. Features of the invention are not necessarily shown to scale in the drawings.

In accordance with the present invention, it has been found that a high laser absorption copper conductor minimizes the laser energy needed to delete the fuse portion. Significantly, this type of fuse structure allows for formation of copper fuses that can be deleted with appreciably less incident energy, mainly by increasing the absorptivity of the fuse link. This would further allow for closer spacing or smaller dimensions of fuse links and adjacent circuitry.

The invention utilizes a metal wiring line containing a fuse link segment wherein the fuse link segment is composed of a stack of at least two electrically conductive metallic materials. The underlayer film in the stack of metallic materials is the primary electrical conductor of the integrated circuit wiring line. Preferably, this underlayer is metallic copper, although other highly electrically conductive material may be used. The overlayer metal is also an electrical conductor. However, its thickness, composition, and optical properties are chosen such that the combination of the overlayer metal with the underlayer metal provides for high absorption characteristics to incident infrared energy. The high absorption of the structure more effectively couples the infrared laser energy into the underlayer portion of the fuse link, minimizing the amount of laser energy required to delete or blow the fuse.

The overlayer can provide additional benefits in addition to increasing the absorption of laser energy by the fuse link. For example, an overlayer of titanium-tungsten, having 10% titanium by weight, on a copper underlayer forms a protective layer for the copper, shielding it from damage by subsequent process steps such as reactive ion etch of overlayer passivation films. For wire bond designs, the overlayer can provide a base for electroless gold plating into the passivation via areas, forming easy to scale (shrink) probe and bond structures. For C4 designs, the overlayer facilitates the use of a variety of BLM (ball limiting metallurgy) structures as it provides an extra barrier film to penetration of metals, Sn for example, in the C4 through the BLM. Other attributes of the fully covered last metal line is the reduction or elimination of the need for a nitride layer, in contact with the top of the copper line, to prevent copper diffusion into the oxide.

FIG. 1 compares the increase in absorbed infrared laser energy when a copper fuse is overlaid with tungsten to that of a copper fuse without the overlayer. Curve A depicts a copper fuse having a silicon oxide ($SiO_2$) passivation film but without an overlayer. As shown, approximately five percent (5%) of the infrared energy (at a 1.04 $\mu$m wavelength) is absorbed by the fuse for deletion of the copper conductor element. This absorption is relatively constant over various thickness of the $SiO_2$ passivation film ranging from 6000 angstroms to 0 angstroms. (The negative sign on the abscissa of FIG. 1 is strictly to facilitate calculations.) Curve B depicts the same copper fuse with $SiO_2$ passivation layer, however, a 500 angstrom tungsten layer is applied as an overlayer onto the fuse structure. Significant absorption characteristics are achieved by this application. As shown, the percent of absorbed infrared laser energy may vary approximately sinusoidally with varying $SiO_2$ passivation layer thickness, but remains within a substantially increased range of 35–60% absorption of incident infrared laser energy. This is a 7–12 fold increase in absorption of infrared laser light at this measured wavelength as compared to the same fuse without the tungsten overlayer.

Two methods are introduced to form the disclosed structure. The first considers the overlaying of the entire copper conductor line to form a fuse structure. The second applies selective etching to strategically place the fuse structures on the underlayer copper line.

FIGS. 2A–F depict a method of where an overlayer is non-selectively applied to the copper conductor fuse links, i.e., the overlayer is not restricted to a portion of the underlayer copper wire.

Figure 2A:
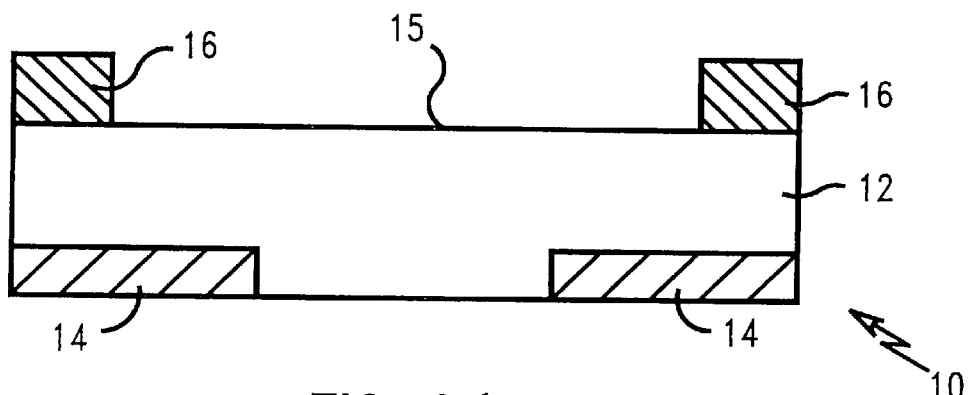
FIG. 2A is a cross-section of a semiconductor substrate with a first photoresist for imaging a fuse line thereon.
Figure 2B:
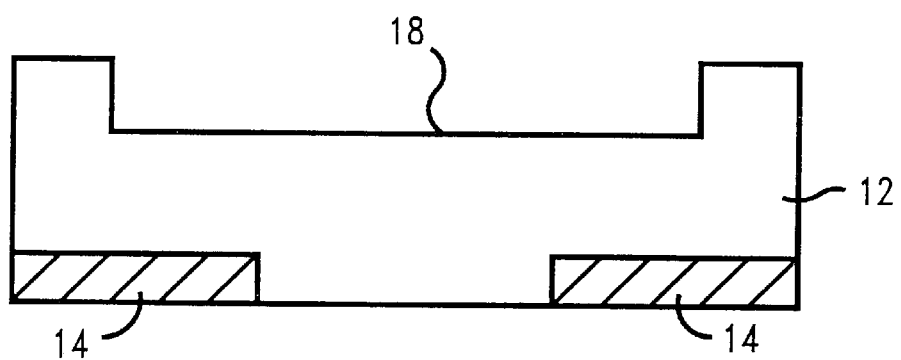
FIG. 2B is a cross-section of the semiconductor substrate of FIG. 2A with an oxide layer etched to form a damascene trench.
Figure 2C:
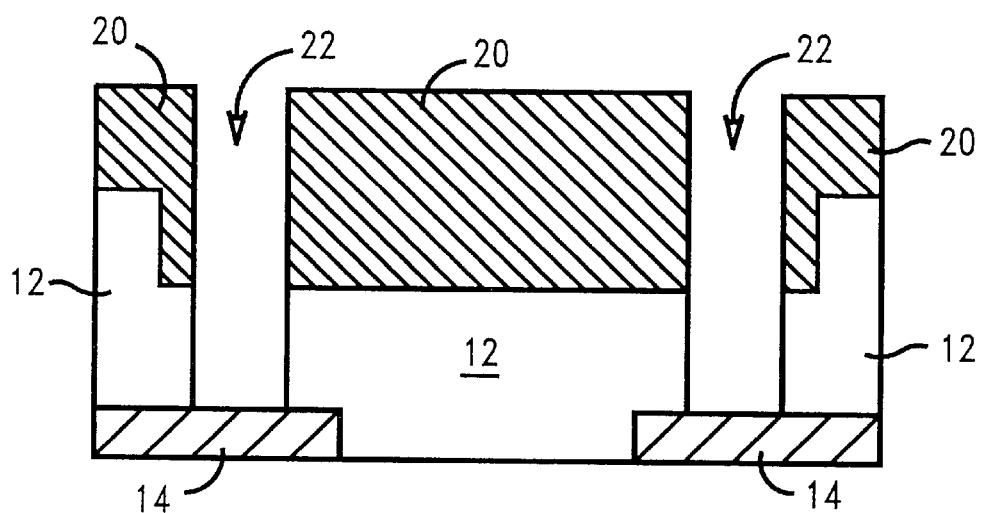
FIG. 2C is a cross-section of the semiconductor substrate of FIG. 2B further including the application of a second photoresist for the imaging and etching of vias.

In FIG. 2A a fuse line is imaged on the surface of semiconductor substrate 10. An oxide layer 12 is applied over LM-1 structures 14. A photoresist mask 16 is then applied, outlining the fuse line area 15. Next, the oxide is etched to form a damascene trench 18, as shown in FIG. 2B. A second photoresist 20 is then applied, FIG. 2C, for imaging and etching vias 22. The etching opens these vias 22 down to the LM-1 structures 14.

Figure 2D:
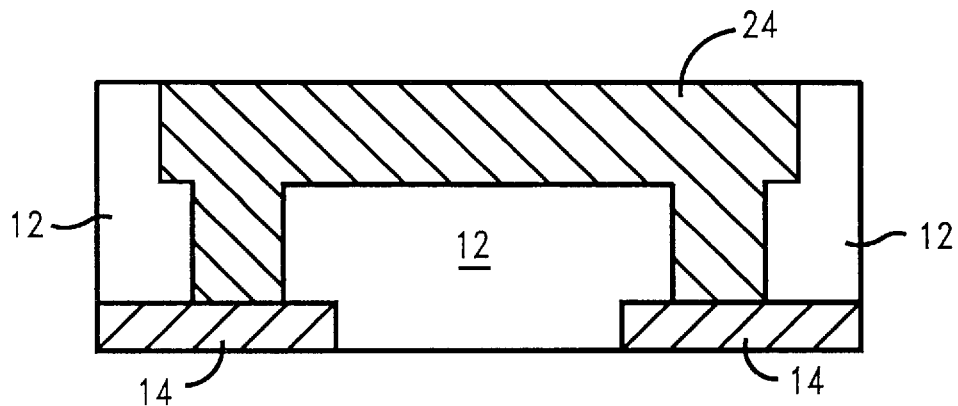
FIG. 2D is a cross-section of the semiconductor substrate of FIG. 2C with the resist stripped, and the new damascene trench filled with a first conductive material.

As shown in FIG. 2D, the second resist 20 is then stripped leaving a trench, and this new damascene trench is filled with a first conductive material 24. Preferably, this material is copper or a composition predominantly copper by weight or volume. However, other conductive metals or metal compositions may be used, provided the interaction with the overlayer facilitates the desired infrared laser absorption.

Figure 2E:
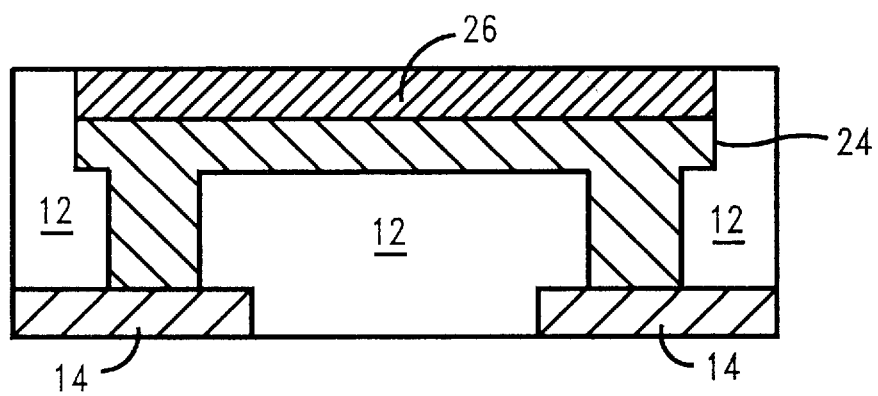
FIG. 2E is a cross-section of the semiconductor substrate of FIG. 2D having the first conductive material recessed to a predetermined thickness of an overlayer material, and filling the recessed area with the overlayer material.

In FIG. 2E, the first conductive material 24 is then recessed to the desired thickness of the overlayer material. This recess is typically performed using a blanket wet etch, e.g. ammonium persulfate. It has been found that a 500 angstrom depth is optimum for the preferred overlayer materials. The overlayer material or second material 26 is then filled in the recessed area. The second material 26 encompasses the desired optical properties to enhance absorption of infrared laser light in the 1.0 to 1.4 $\mu$m wavelength range. As indicated in FIG. 1, a preferred tungsten overlayer will achieve this result. Additionally, a titanium-tungsten overlayer having ten percent titanium by weight is most preferred.

Figure 2F:
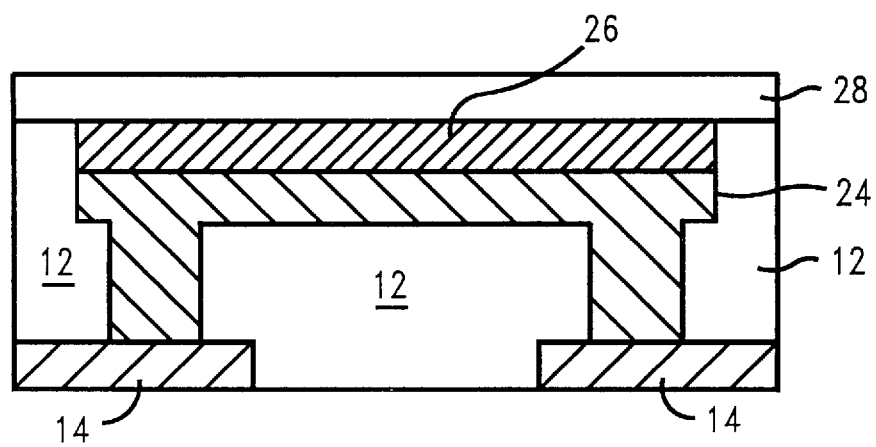
FIG. 2F is a cross-section of the semiconductor substrate of FIG. 2E with a passivation layer applied to the top of the overlayer.

Lastly, as indicated in FIG. 2F, a passivation layer 28 is applied over the fuse line structure of FIG. 2E as a protective barrier.

Figure 3A:
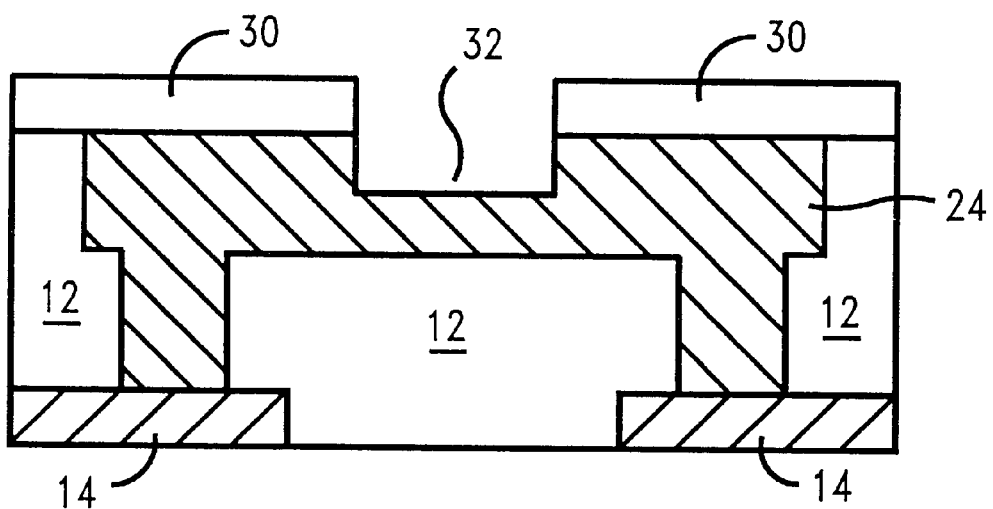
FIG. 3A is a cross-section of the semiconductor substrate of FIG. 2D, having a photoresist applied for selectively etching the area for the overlayer.
Figure 3B:
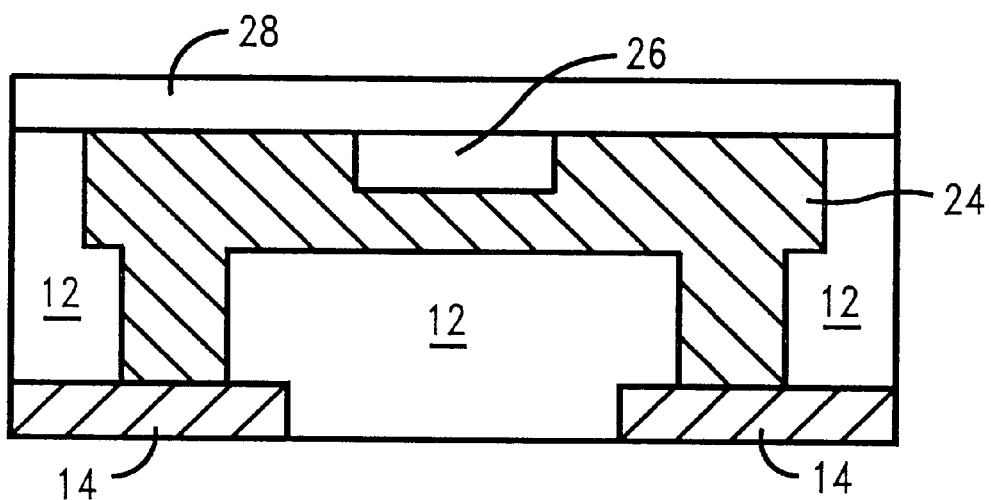
FIG. 3B is a cross-section of the semiconductor substrate of FIG. 2E with the recessed area filled with a second material of predetermined optical and absorptive properties, and a passivation layer applied.

During the overlayer application, if the titanium-tungsten metal composition is desired only in select portions of the fuse area, a conventional photoresist mask can be used to limit the area of the copper wiring line that is recessed. FIGS. 3A and 3B depict this selective process.

FIGS. 2A–D represent the first four steps to initiate this selective process. However, as shown in FIG. 3A, after the second resist 20 is then stripped, and the new damascene trench is filled with a first conductive material 24, a third resist 30 is then applied. This resist is imaged, and after etching only a selective portion 32 of the first conductive metal 24 is recessed to the desired thickness of the overlayer.

In FIG. 3B, the third photoresist 30 is stripped, and the selective recessed portion 32 is filled with the second material or overlayer 26. This second material is then planarized, preferably by a chemical-mechanical polishing process, and, similar to the non-selective process, a passivation layer 28 is applied.

The combination of an absorptive overlayer on the primary electrical conductive underlayer increases the efficiency for the deletion of the integrated circuit metal fuses typically formed from highly reflective metals, such as copper, and the like. Because the infrared energy is more efficiently coupled into the fuse structure, the invention is useful for fuses formed from thick metal films, and for fuses formed from very high melting temperature metals. In each of these cases, the incident laser energy can be minimized (relative to a structure comprised of just the reflective metal underlayer itself) resulting in avoidance of substrate damage and collateral damage to adjacent fuse structures. The thickness of the overlayer absorptive metal can be tailored to the needs of the reflective (underlayer) conductor, the overlayer passivation film stack, and the like. The structure is compatible with any thickness of LM conductor underlayer greater than about 500 angstroms, however, the overlayer itself requires approximately 500 angstroms of thickness to facilitate adequate absorption. This fuse structure is also valuable for technologies using a damascene polishing process to define wiring levels.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
What is claimed is:

1. A radiation absorbing conductor having a top surface and a given conductivity characteristic that can be substantially altered by said radiation, comprising an electrical conductor having a bottom first layer of a first material that is substantially insensitive to said radiation, and a top second layer of a second material that is sensitive to said radiation, wherein said top second layer covers said bottom first layer forming a protective coating over said bottom first layer, and is exposed to said radiation incident on said conductor top surface, such that upon exposure to said radiation, a portion of said bottom first layer and a portion of said top second layer are deleted to form a non-conducting path.

2. The conductor of claim 1 wherein the sensitivity of said second material is to radiation emitted from a laser in an infrared energy spectrum.

3. The conductor of claim 1 wherein said bottom first material is a primary electrical conductor insensitive to said radiation and said top second material is an electrical conductor of a composition sensitive to said radiation and adapted to absorb said radiation, such that when combined with said primary electrical conductor provides for a high infrared energy absorbing structure.

4. The conductor of claim 3 wherein said first material is copper.

5. The conductor of claim 3 wherein said second material is tungsten.

6. The conductor of claim 3 wherein said second material is a titanium-tungsten composition.

7. The conductor of claim 6 wherein said titanium-tungsten composition comprises ten percent titanium by weight.

8. The conductor of claim 2 wherein said infrared energy spectrum comprises energy having wavelengths in the range of 1.0 to 1.4 $\mu$m.

9. The conductor of claim 1 wherein said second material layer provides a protective layer for said first material and a barrier against diffusion.

10. The conductor of claim 1 wherein said first layer of said first material is greater than or equal to 500 Angstroms in thickness, and said second layer of said second material is greater than or equal to 500 Angstroms in thickness.

11. A radiation absorbing conductor having a top surface and a given conductivity characteristic that can be substantially altered by said radiation, comprising an electrical conductor having a bottom first layer of copper material that is substantially insensitive to said radiation, and a top second layer of a second material that is sensitive to said radiation, wherein said top second layer covers said bottom first layer forming a protective coating over said bottom first layer, and is exposed to said radiation incident on said conductor top surface, such that upon exposure to said radiation, a portion of said bottom first layer and a portion of said top second layer are deleted to form a non-conducting path.

* * * * *